United States Patent [19]

Brown

[11] Patent Number: 5,420,538

[45] Date of Patent: May 30, 1995

[54] LINEAR BIPOLAR JUNCTION TRANSISTOR AMPLIFIER

[75] Inventor: Anthony K. D. Brown, Kanata, Canada

[73] Assignee: Northern Telecom Limited, Montreal, Canada

[21] Appl. No.: 257,975

[22] Filed: Jun. 10, 1994

[51] Int. Cl.$^6$ .............................................. H03F 3/45
[52] U.S. Cl. ............................. 330/252; 330/261; 330/149; 330/295
[58] Field of Search ................ 330/252, 261, 295, 149

[56] References Cited

U.S. PATENT DOCUMENTS

| | | | |
|---|---|---|---|
| 4,965,528 | 10/1990 | Okanobu | 330/252 |
| 5,006,818 | 4/1991 | Koyama | 330/261 |
| 5,079,515 | 1/1992 | Tanimoto | 330/256 |

FOREIGN PATENT DOCUMENTS 2256550  12/1992  United Kingdom ................ 330/252

Primary Examiner—James B. Mullins
Attorney, Agent, or Firm—George MacGregor

[57] ABSTRACT

A linear bipolar junction transistor amplifier. The linear gain is achieved by an offset voltage created by ratioed transistors wherein the ratio is an integer. The ratios are achieved either by connecting equal transistors in parallel or by employing multiple emitters on a single transistor. This results in a linear amplifier which is substantially independent of manufacturing process tolerance variations as well as power supply and temperature variations.

10 Claims, 9 Drawing Sheets

LINEAR BIPOLAR JUNCTION TRANSISTOR AMPLIFIER

FIELD OF THE INVENTION

This invention relates to a linear differential amplifier and more particularly to a linear amplifier having three differential pairs of bipolar transistors, the gain characteristic being linearized by an offset voltage created by ratioed emitters, wherein the ratio is an integer.

BACKGROUND OF THE INVENTION

Bipolar junction transistors are non-linear transconductors and for this reason their use in linear amplifiers requires the use of special techniques such as negative feedback. Without feedback, a simple differential pair as shown in FIG. 1 has a very non-linear gain as illustrated graphically in FIG. 2. Negative feedback can be applied to a single stage amplifier in shunt mode, as in a transimpedance amplifier, or in serial mode, as in the application of emitter degeneration, or, sometimes in both shunt and serial feedback modes simultaneously. Such application of feedback generally requires the use of resistors as linear circuit elements to control the amplifier gain. In low noise amplifier applications, the use of resistors can be a disadvantage since they are a well known source of thermal noise and this impairs the amplifier noise figure. A further disadvantage of series negative feedback is that the amount of feedback depends upon the transistor bias level and in the case of a variable transconductance amplifier, the amount of feedback varies also and consequently so does the amplifier linearity. As a result, series negative feedback can be inappropriate for variable transconductance amplifiers.

PRIOR ART

One solution to the problem of transconductor non-linearity of bipolar junction transistors was proposed by Okanobu in U.S. Pat. No. 4,965,528 issued Oct. 23, 1990. In the '528 patent the single differential pair is replaced with a pair of differential transistor pairs having ratioed transistors. According to one aspect of the patent the emitter sizes are ratioed such that in one of the pairs the emitter of one of the transistors is larger than the other by a set factor, e.g., four; while in the second pair the opposite transistor has the larger emitter based on the same ratio. Each pair of transistors is supplied with the same tail current and their inputs and outputs are connected in parallel. As a result of the ratioed emitters, the peak gain for each differential pair is offset from the centre of the input/output characteristic (in comparison to a conventional differential pair whose gain is maximized at the centre of its input/output characteristic). For emitter size ratios greater than five the combination of the two differential pairs with ratioed emitters results in the combined input/output characteristic having two maxima in the gain characteristic, either side of the centre of the range and a substantially linear characteristic in between the two maxima. This improvement in the BJT transfer characteristic is sufficient for many applications.

In U.S. Pat. No. 5,006,818 which issued Apr. 9, 1991 to Koyama et al, variations on the two differential pairs concept are disclosed. In applications where amplifier linearity is critical, however, some attempts have been made to improve the linearity by incorporating additional series negative feedback as well as attempting to compensate the dip in the gain characteristic at the centre of the range. This latter approach suffers from the disadvantage that the resistive elements once again contribute noise to the amplifier circuit (as well as lowering its gain). For maximum flatness of the amplifier gain at the smallest signal levels, Okanobu in the '528 patent presents an analysis based upon an idealized transistor transfer function described by Equation 1

$$I = I_0 \exp(K/V)/\{1 + \exp(K/V)\} \quad \text{(EQ 1)}$$

where:

$I_0$ = amplifier collector currents;
$V$ = amplifier input voltage;
$K = q/KT$

From calculations based on this equation Okanobu specifies that the optimum ratio N for maximum flatness of the transistor amplifier at the smallest signal levels is $2 + 3^{\frac{1}{2}}$, or 3.732. Such an analysis satisfies the desire for a clear mathematical closed form solution, but it is nevertheless based upon an approximate theoretical model which does not account for parasitic components of a practical transistor.

In U.S. Pat. No. 5,079,515 which issued Jan. 7, 1992 to Tanimoto, a linear differential amplifier is disclosed which utilizes two differential pairs having ratioed emitters to increase the linearized region. In the '515 patent the ratio is higher than that taught by Okanobu, and a third differential pair of equal transistors is added to level out the central dip in the gain characteristics. Tanimoto's analytical approach utilizes an idealized transistor characteristic. In his description of an arrangement of three differential pairs, Tanimoto attempts to derive an optimum value for the ratio N for a maximally flat gain characteristic at small signal levels and also a solution providing an equal ripple approximation to a flat gain characteristic. The first derivation yields his specified value for the ratio N of 7.872983 together with precise weightings for the current sources supplying the tail currents of the differential pairs in the ratio (1:0.64:1) corresponding to his maximally flat solution. The second derivation for the equal ripple approximation yields tail currents of the differential pairs in the ratio (1:0.7593:1). In each of his arrangements Tanimoto derives precise ratios for the differential pairs and precise current weightings for the tail currents of the differential pairs.

There are two disadvantages of the methodologies described in the prior art as summarized by the foregoing discussion. First, the circuits have been derived for relatively low frequency application, Okanobu quotes results at 1 kHz and Tanamoto quotes results at 30 kHz. However, at microwave frequencies the dimensions of transistor emitter widths are generally less than a micron. Lithographic accuracy for typical 0.8 micron emitter widths are typically about ±0.1 micron. In addition the matching of the achieved emitter lengths is less than this due to the rounding effect that takes place at the ends of the stripe emitters. Thus for two emitters of similar width and a drawn length ratio of 'N', the actual final emitter length varies from the specified one by a significant amount. It is practically impossible to prescribe ratioed emitters in either their length or width dimensions.

A second disadvantage of the forgoing methodologies arises from the lack of consideration of the effects of offset voltage. Although offset voltage can be reduced at low frequencies by utilizing large transistors, such an approach can be impractical at microwave frequencies where large transistors require larger power to maintain the transistor speed. Indeed for a typical medium sized transistor, the distortion due to offset voltage alone can be as high as 50 dB below signal level. This can totally mask the benefits of optimizing a circuit for a maximally flat gain characteristic.

SUMMARY OF THE INVENTION

The present invention seeks to provide a linear differential amplifier which overcomes the limitation of the prior art, by utilizing three differential pairs, of which two pairs have ratioed transistor emitters, the ratios being integers. This is consistent with microwave transistor requirements since identical microwave transistors can be matched with a statistical collector current distribution having a sigma of 1 percent and ratios can be achieved by connecting transistors in parallel, or by employing multiple emitters on a single transistor.

Accordingly, it is an object of the present invention to provide a linear differential amplifier having all ratioed transistors in which the ratio is an integer.

It is a further object of the invention to provide a linear amplifier having ratioed transistors wherein the differential pairs and the tail current sources employ only integer ratios of their emitter sizes.

Therefore in accordance with the present invention there is provided a linear amplifier comprising a first differential pair having first and second bipolar transistors; a second differential pair having third and fourth bipolar transistors; a third differential pair having fifth and sixth bipolar transistors; first, second and third constant current sources, said first current source connected to commonly connected emitters of said first and second transistors, said second current source connected to commonly connected emitters of said third and fourth transistors, said third current source connected to commonly connected emitters of said fifth and sixth transistors, respective bases of said first, third and fifth transistors connected to a first input; respective bases of said second, fourth and sixth transistors connected to a second input, respective collectors of said first, third and fifth transistors connected to a first output, respective collectors of said second, fourth and sixth transistors connected to a second output, said first and second outputs being connected to a positive supply via first and second load resistors respectively, wherein the gain of said amplifier is linearized by an offset voltage generated by ratioed bipolar transistors, the ratio being an integer.

BRIEF DESCRIPTION OF THE DRAWINGS

The invention will now be described in greater detail with reference to the attached drawings wherein.

(For convenience, transistor emitter sizes relative to the smallest emitter size allowed are denoted 5× for a 5 times smallest size transistor. Emitter size ratios however are denoted 1×, 5×, N× for ratios of 1, 5 and N respectively.)

DETAILED DESCRIPTION OF INVENTION

Figure 1:
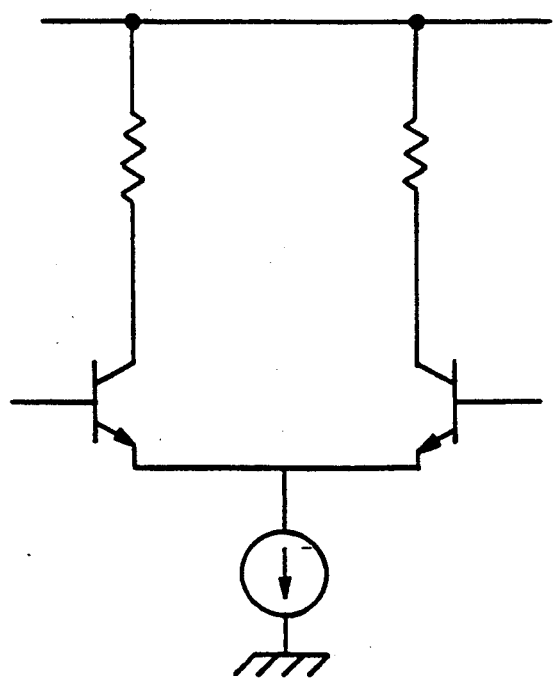
FIG. 1 is a simple bipolar differential pair according to the prior art.
Figure 2:
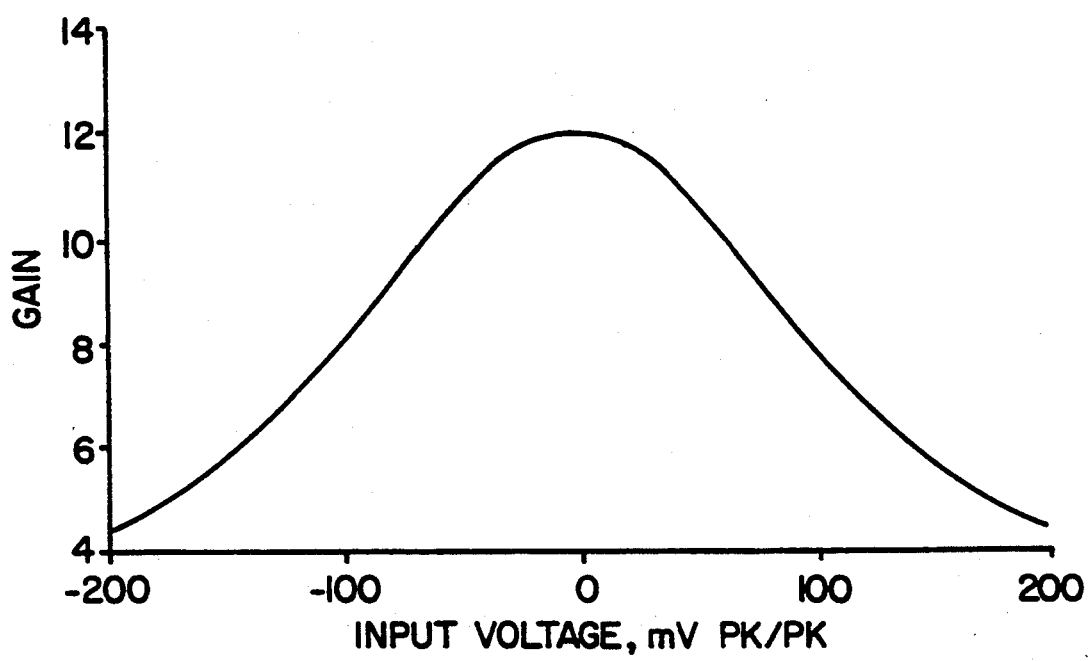
FIG. 2 is the gain characteristic of the bipolar pair of FIG. 1.

As discussed previously, a simple differential pair as shown in FIG. 1 has a non-linear gain characteristic. This is shown in FIG. 2 wherein the gain peaks at zero input voltage; and decreases as the input voltage moves away from the centre.

Figure 3:
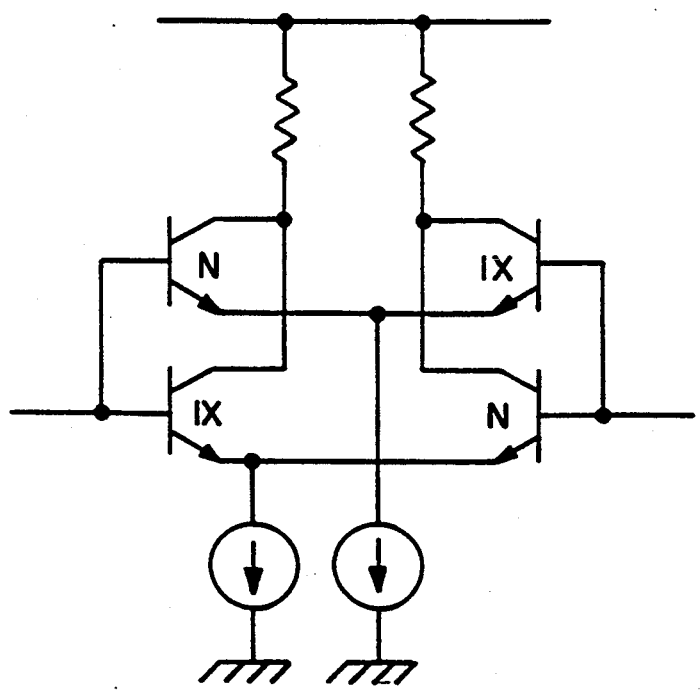
FIG. 3 is a circuit diagram of an amplifier having two differential pairs with ratioed emitters.
Figure 4:
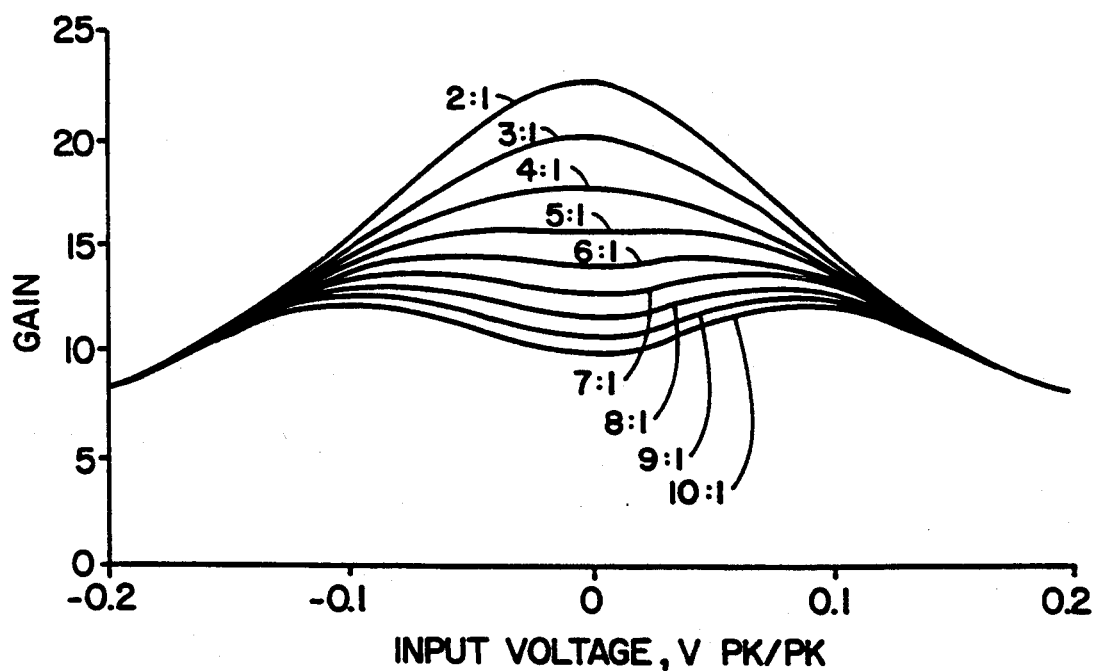
FIG. 4 shows the variation of gain characteristics for the amplifier of FIG. 3 with various emitter size ratios.

In the prior art linear amplifier of FIG. 3, each of the two differential pairs have emitters commonly connected to current supplies. The inputs and outputs are connected in parallel. In FIG. 3 the emitter of one transistor in a differential pair is larger than the other by a factor N. The second pair has the same ratio for emitter sizes with the position being reversed. FIG. 4 shows the gain characteristic of the amplifier of FIG. 3 for different values of N. It will be noted that for values of N less than about 4.5 the gain characteristic peaks. For values of N greater than about 4.5 the gain shows two maxima with a dip at zero voltage. For certain applications the linearity obtained for N=4.5 is adequate but where linearity is critical other methods of linearizing the gain characteristics are required. As indicated hereinbefore feedback resistance can be used to improve linearity but at the expense of noise.

In the present invention a more thorough numerical analysis based upon a precise SPICE model of the transistors yields different results. It should be noted that as the ratio of the transistor emitters is increased above a value of 5, the separation of the two gain maxima from the centre of the range is increased, thus allowing for larger input signal swings, and also the non-linearity over the centre of the range between the two maxima increases with their separation. This is illustrated in FIG. 4 for various integer ratios from 2 to 10. From observation of the shape of the curves of FIG. 4, it is clear that the curvature between the two maxima goes through a minimum for an emitter ratio of about 4.5. Consequently, one solution which presents a low level of distortion is to employ two differential pairs with integer emitter ratios of 5, or more exactly (9:2). This ratio of 5 solution permits input signal levels up to 40 mV peak to peak with a total harmonic distortion level of less than −60 dB reference signal level at room temperature. A ratio of 9:2 permits this range to be extended to about 50 mV peak to peak input signal level. This can be compared to a ratio of 4 which is close to Okanobu's recommended value (3.8) and which yields a range of up to about 25 mV peak to peak for a total harmonic distortion level of less than −60 dB. This illustrates the limitations of the circuit arrangement of FIG. 3 in terms of the input signal level which can be tolerated at low distortion levels.

Figure 5:
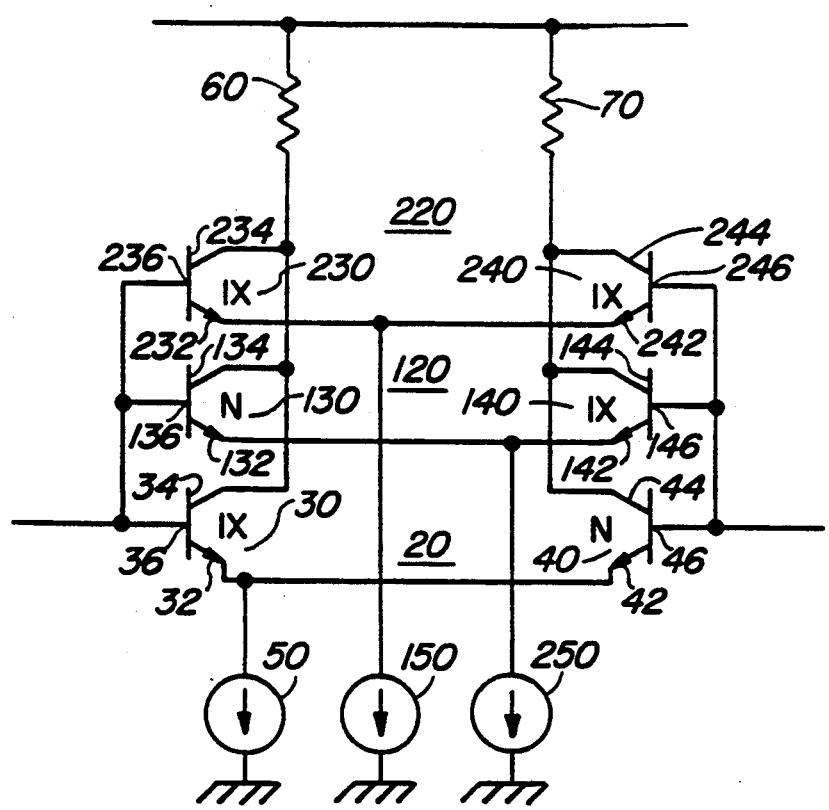
FIG. 5 is a circuit diagram of a linear amplifier according to the present invention.

A preferred circuit arrangement which extends the range of input signal level is shown in FIG. 5 in which a third differential pair is used to cancel the non-linearity of the two ratioed differential pairs as the ratio is increased above 5. A similar arrangement has been described by Tanimoto in U.S. Pat. No. 5,079,515. In the arrangement of the present invention, however, all transistor emitter size ratios are integers. This is consistent with microwave transistor requirements since identical microwave transistors can be matched with a statistical collector current distribution having a sigma of one percent and ratios can be achieved by connecting transistors in parallel, or by employing multiple emitters on a single transistor.

The purpose of the invention is to linearize the portion of the amplifier characteristic which lies between the two gain maxima. First, the location of each maximum from the centre of the range due to each individual differential pair can be calculated at room temperature from the well known diode equation:

$$\delta V = 0.0259 \times \text{Log}_e(N) \quad \text{(Eq 2)}$$

Here 'N' is the ratio of the transistor emitters. A further stipulation is that no feedback resistors can be employed and also for ease of integration and manufacture, only integer ratios of transistor emitters employing multiples of unit transistors, or transistors with integer multiples of unit emitters, will be used in order to accurately maintain the transistor ratios. According to these requirements a precision amplifier is obtained which is substantially independent of manufacturing process tolerance variations as well as power supply and temperature variations.

Figure 6:
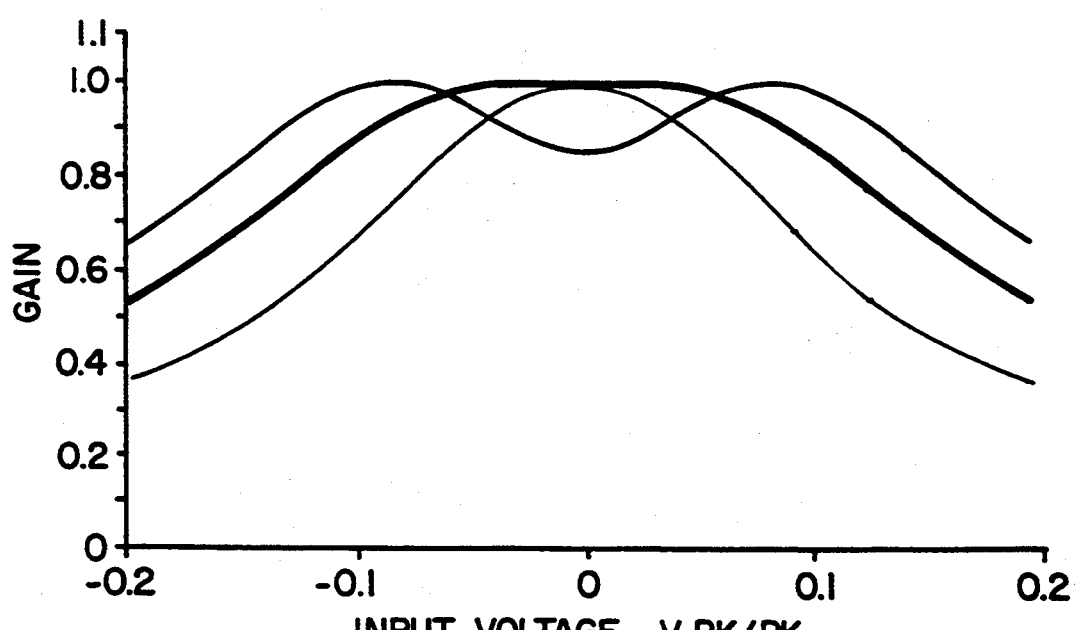
FIG. 6 is a graph showing a comparison of the linearized amplifier of FIG. 5 with a normal differential pair.

In order to provide for such an amplifier, the depth of the 'dip' at the centre of the range between the two maxima is compensated with a third differential pair whose emitters are the same size and whose gain peaks at the centre of the range to compensate for the dip between the two maxima, (see FIG. 6). Further, this third differential pair is subject to the same restrictions, namely that all transistors associated with it are made of unit transistors, or integer multiples thereof. This stipulation, of course, includes the transistors used in the current mirror which supplies the amplifier tail currents. Two possible arrangements have been found in which a ratio of N=8, or N=9, for the ratioed emitters can be compensated by a simple differential pair having exactly the same tail current as the ratioed transistor pairs. It is clear that the cancellation of the curvature of the curve of the ratioed differential pairs is an approximate fit due to variation of the curvature over the range between the two maxima. Initially ignoring the effects of offset voltage, the ratio N=8 appears to provide the best fit for small signal levels up to input levels of 60 mv peak to peak with a total harmonic distortion below −65 dB reference signal level, The ratio N=9 appears not quite so good over this range but provides a total harmonic distortion of better than −60 dB up to input signal levels of 90 mV peak to peak at 100 MHz at room temperature. However in practice the ratio of N=8 has no advantage at small signal levels due to the statistical effects of offset voltage as explained below. It will be shown that a ratio of N=9 provides optimum performance.

Figure 7:
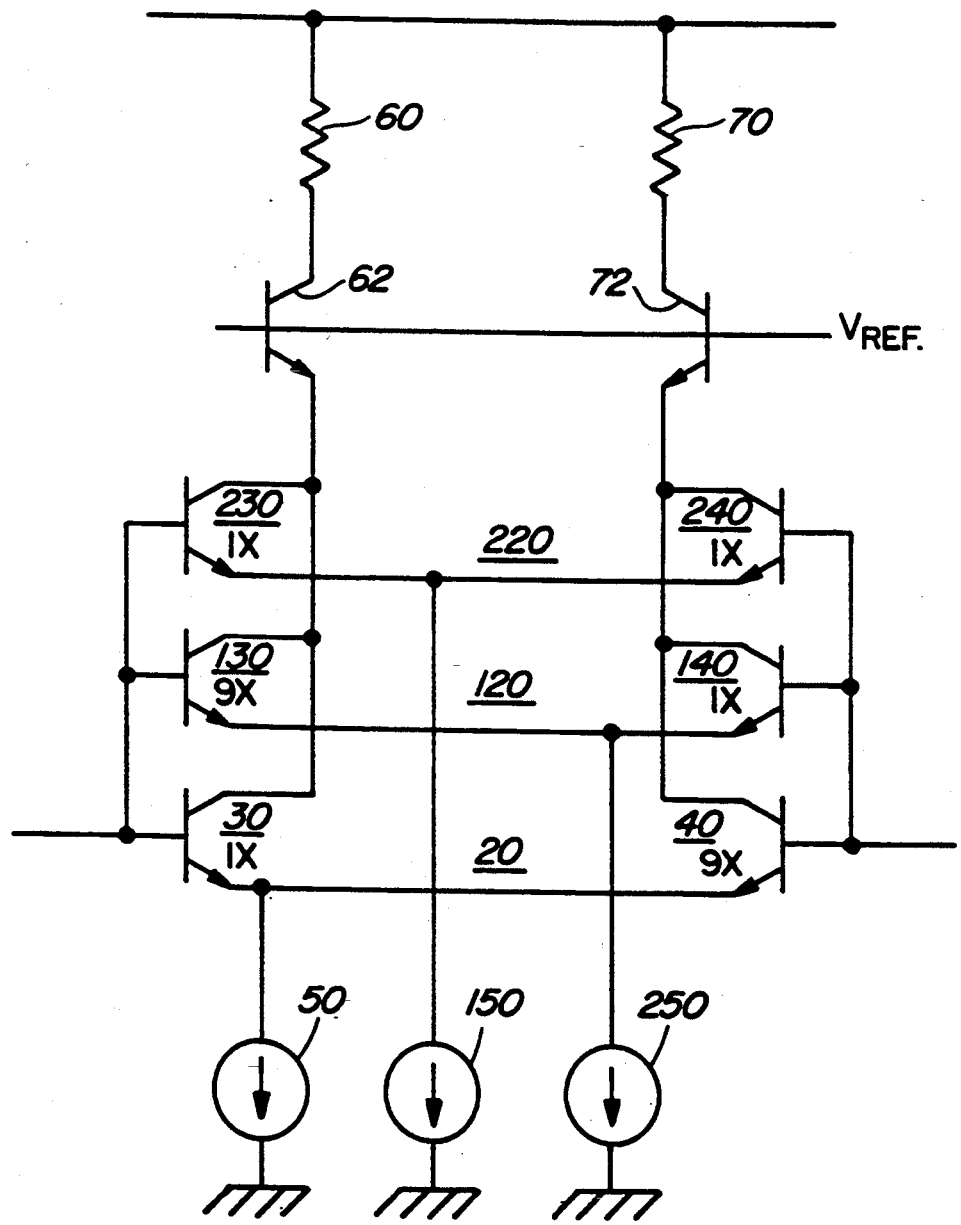
FIG. 7 is a circuit diagram of the linear amplifier of FIG. 5 with cascode output stage.
Figure 8:
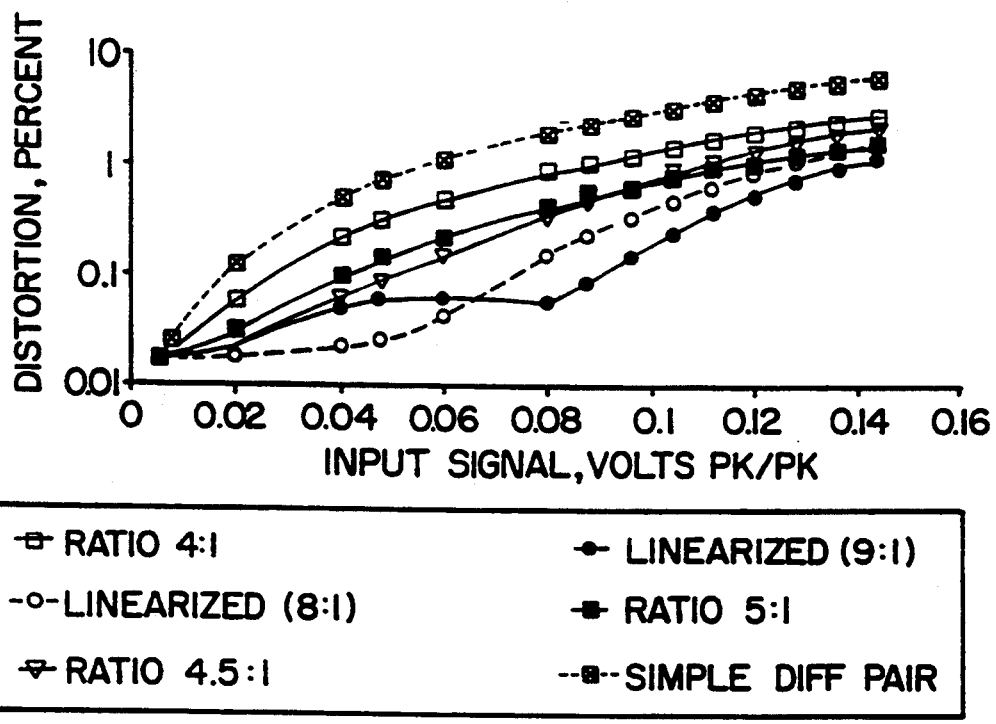
FIG. 8 shows total harmonic distortion vs. input voltage for various emitter size ratios.
Figure 9:
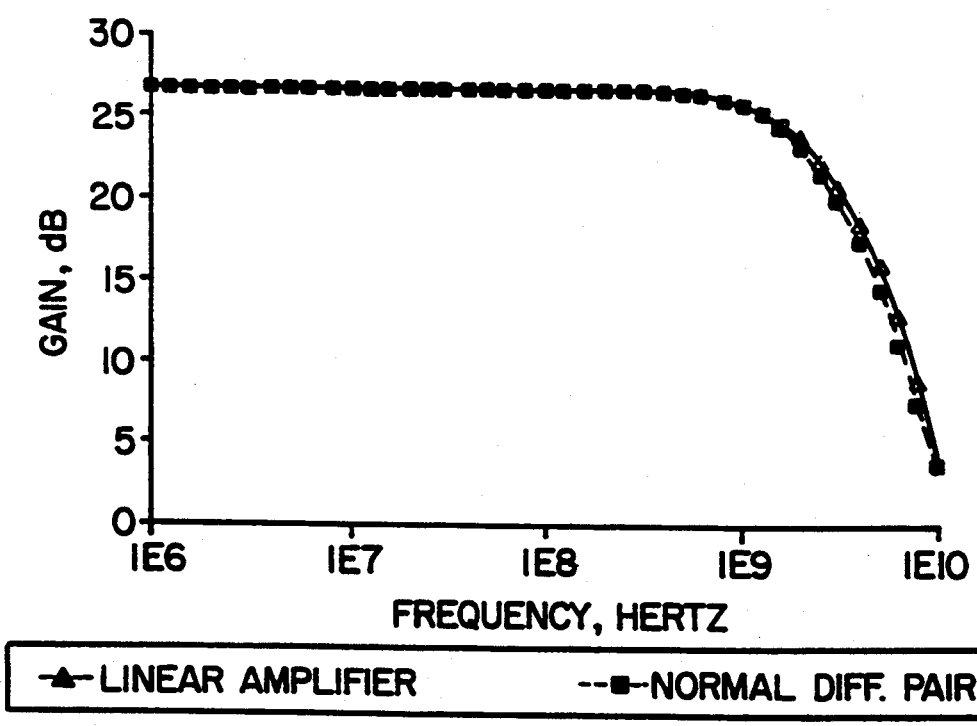
FIG. 9 shows the frequency response of the amplifier of FIG. 7 compared to a regular differential pair amplifier with the same output stage.
Figure 10:
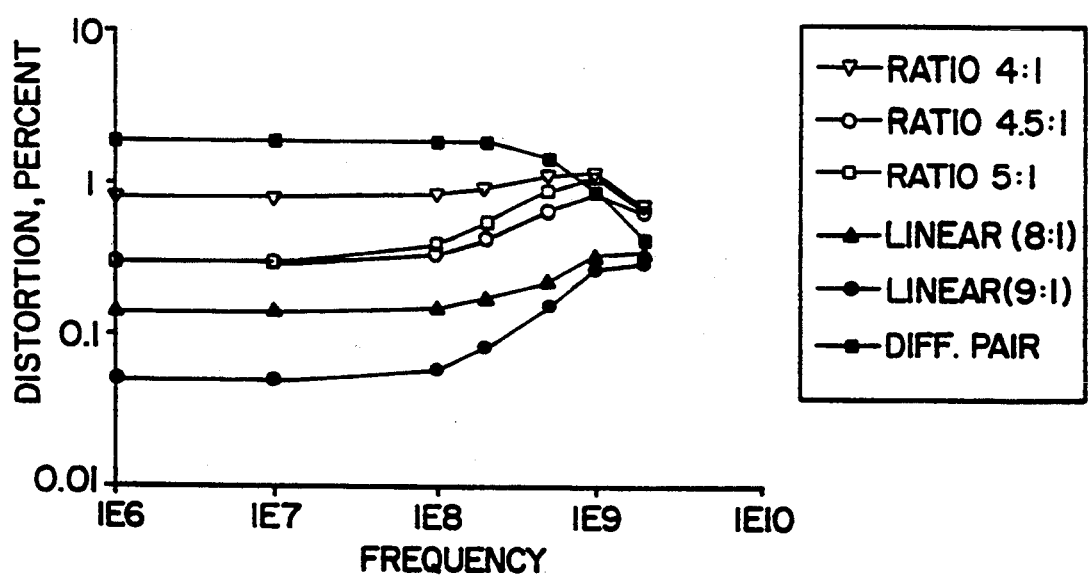
FIG. 10 is a graph of total distortion with frequency for different emitter size ratios.

The total harmonic distortion of the circuits described here was computed and is shown in FIG. 8 for various arrangements including a simple differential pair, two differential pairs with ratios of N=4, N=4.5 and N=5 for the circuit of FIG. 3 and three differential pairs with ratios of N=8 and N=9 for the circuit of FIG. 7. These results are based upon the transistor SPICE characteristics, assume zero offset voltage, and are dominated by the third harmonic. In each case the circuits were equipped with emitter follower input buffers. The output stage of each circuit was a cascode amplifier (FIG. 7) which permitted operation with a 3 dB bandwidth of 1.9 GHz in a bipolar process with an $f_T$ of 10 GHz (see FIG. 9). Note that the cascode stage is itself essentially distortion free since the cascode collector current variation is substantially the same as that of the emitter for transistors with moderate current gain. The harmonic distortion was computed for the first 10 harmonics at a fundamental frequency of 100 MHz. The bias current was adjusted for each arrangement for a nominal gain of 27 dB. The normal differential pair which was used as a reference employed the same output stage as the improved circuits, but was very much worse both in distortion (−34 dB at 90 mV peak/peak) and also in bandwidth which only just reached 1.6 GHz.

Figure 11:
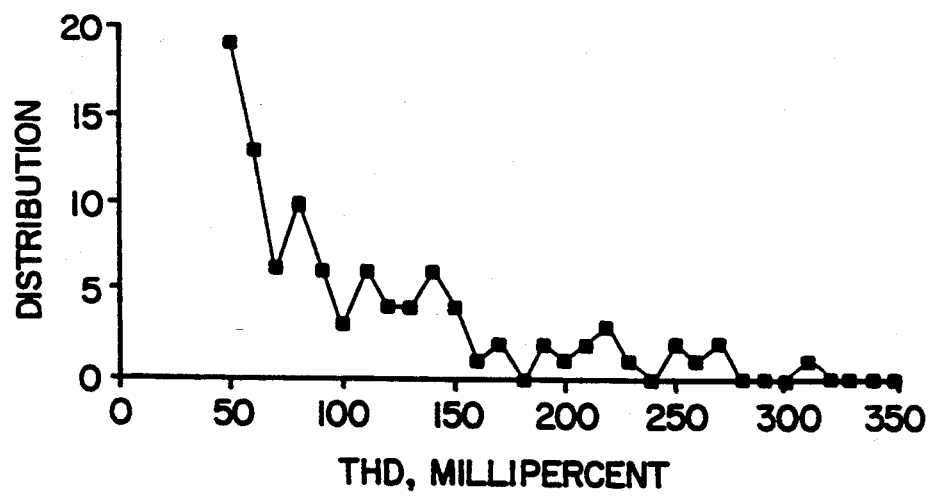
FIG. 11 shows a statistical distribution of second harmonic at 100 MHz due to offset voltage for 5× transistors at 80 mVp/p input signal level.

Due to the statistical distribution of the transistor VBE matching (causing offset voltage) there will be a statistical distribution of second harmonic distortion which will depend upon the size of the transistors used. Based on measured results of VBE matching for typical 0.8 micron wide emitters, the contribution of second harmonic obtained from Monte Carlo Simulation with a sample size of 100 is shown in FIG. 11. For a 5× size emitter (0.8×20 microns) the second harmonic combines with the dominant third harmonic to produce a distribution similar to a Rayleigh distribution. This simulation takes into account the offset voltages of the emitter follower input buffers as well as the matched current sources and the differential pairs. The effects of offset voltage are quite severe so that even with a 3 sigma variation of $V_{BE}$ of ±0.85 mV, which can be considered excellent, the statistical yield at 80 mV p/p input for −60 dB total harmonic distortion is only 57 percent. The 3 sigma limit of the distortion is about −50 dB and the average is −59 dB. Thus second harmonic distortion due to offset voltage dominates the performance in the region of −60 dB and the choice of the ratio N=9 for the circuit of FIG. 7 provides the largest range of input signal level.

In the linear amplifier shown in FIG. 5, a first differential pair 20 comprises bipolar transistors 30 and 40; second differential pair 120 comprises transistors 130 and 140; and third differential pair 220 comprises transistors 230 and 240. As shown the emitters 32,42 of transistors 30,40 are connected together and to current source 50. Current source 50 may be a transistor, transistor resistor pair, or other current source as known in the art. The emitters 132,142 of transistor 130,140 are commonly connected to current source 150. Similarly emitters 232,242 of transistors 230,240 are connected to current source 250. Current sources 50, 150 and 250 are matched so as to provide the same current to each of the differential pairs. Collectors 34, 134 and 234 of transistors 30, 130 and 230 are commonly connected to the amplifier output which is tied to the positive supply via load resistor 60. Collectors 44, 144 and 234 of transistors 40, 140 and 240 respectively are connected to the positive supply via load resistor 70. Bases 36, 136 and 236 of transistors 30, 130 and 230 respectively and bases 46, 146 and 246 of transistors 40, 140 and 240 respectively are connected to differential inputs.

In accordance with the invention and as shown in FIG. 5, transistor 40 of differential-pair 20 is 'N' times larger than transistor 30. Also, transistor 130 of differential pair 120 is 'N' times larger than transistor 40. Transistors 230 and 240 of differential pair 220 are the same size. As indicated previously herein, N is an integer and in a preferred embodiment N is 9.

FIG. 7 illustrates the same three differential pairs 20, 120 and 220 but also including cascode output stages 62 and 72 connected between the amplifier outputs and load resistors 60 and 70 respectively. The transistors have the same size ratios as in the circuit of FIG. 5.

The size ratios may be achieved by connecting N transistors in parallel or by employing N emitters on a single transistor. As indicated previously N is an integer which means that it is not necessary to attempt to process transistors or emitters of a precise dimension as called for in the prior art.

Figure 12:
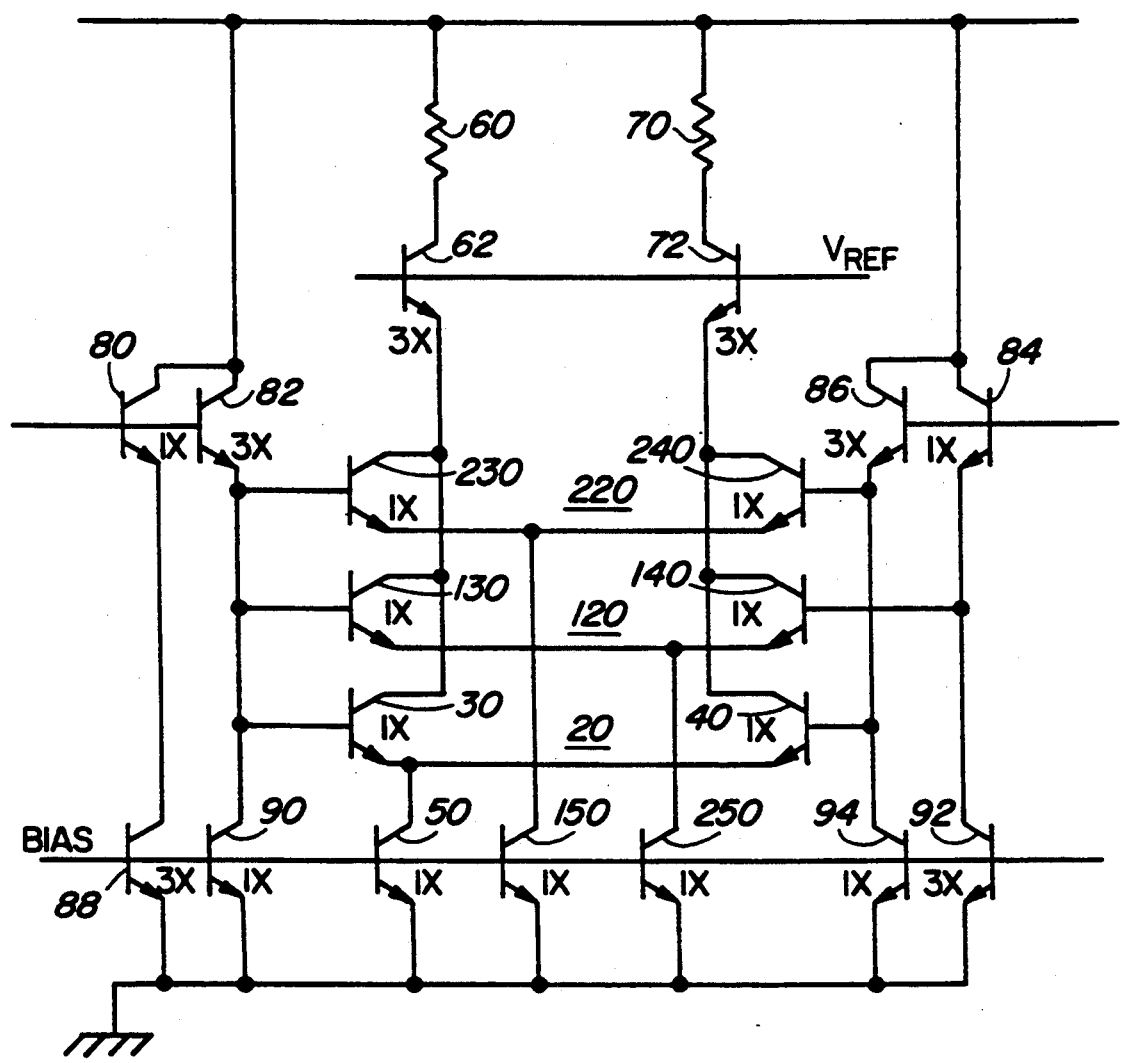
FIG. 12 is a circuit diagram of a second embodiment of the invention.

A second embodiment of the invention is shown in the circuit diagram of FIG. 12. In this configuration the offset voltages are not caused by ratioed transistors in the differential pairs but rather by ratioed transistors in the input emitter followers and the current sources which drive them. Thus, as shown in FIG. 12, 1× transistors are used in the three differential pairs 20, 120 and 220, as well as the current source transistors for each pair. Unlike the prior art, however, the objective of integer transistor emitter size ratios is achieved since the offset due to the ratio of $N=9$ is provided by two offsets which sum the logarithms of their voltage ratios according to the diode equation (EQ 2), yielding integer ratios of $N=3$. As shown in FIG. 12 the input to the differential pairs is via emitter followers, with a first emitter follower 80 providing input to transistor 30 and emitter follower 82 providing input to transistors 130 and 30. Similarly, emitter follower 84 provides input to transistor 140 while emitter follower 86 provides input to transistors 40 and 240. Follower 80 has a current source 88 while followers 82, 84 and 86 have current sources 90, 92 and 94 respectively. As illustrated transistors 82, 86, 88 and 92 are 3× while transistors 80, 84, 90 and 94 are 1×.

Figure 13:
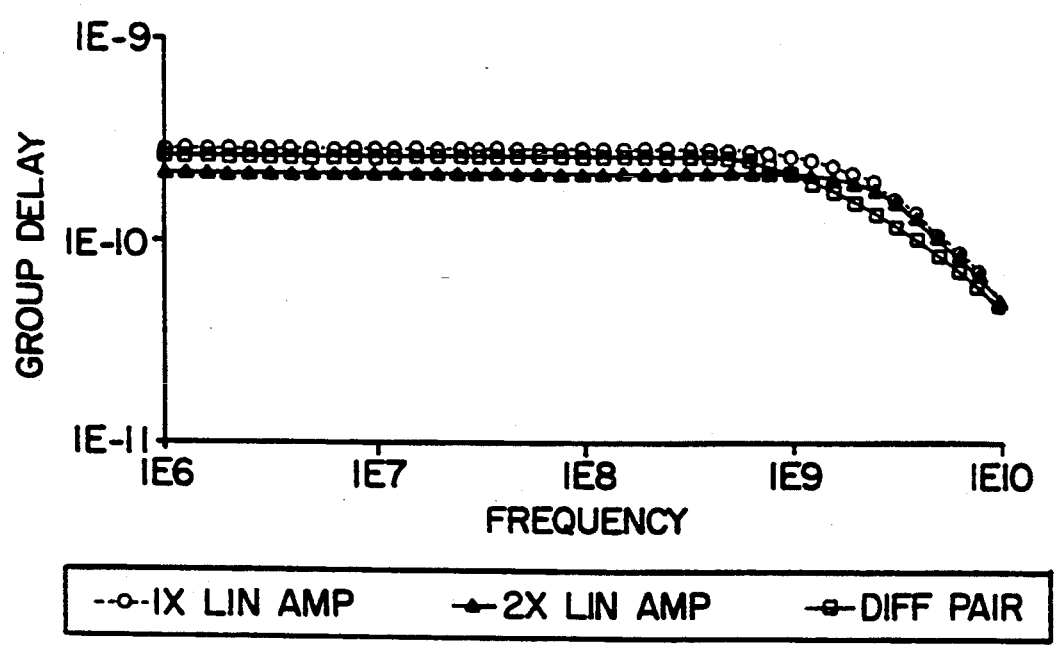
FIG. 13 shows group delay distortion of linear amplifier for 80 mVp/p input signal.
Figure 14:
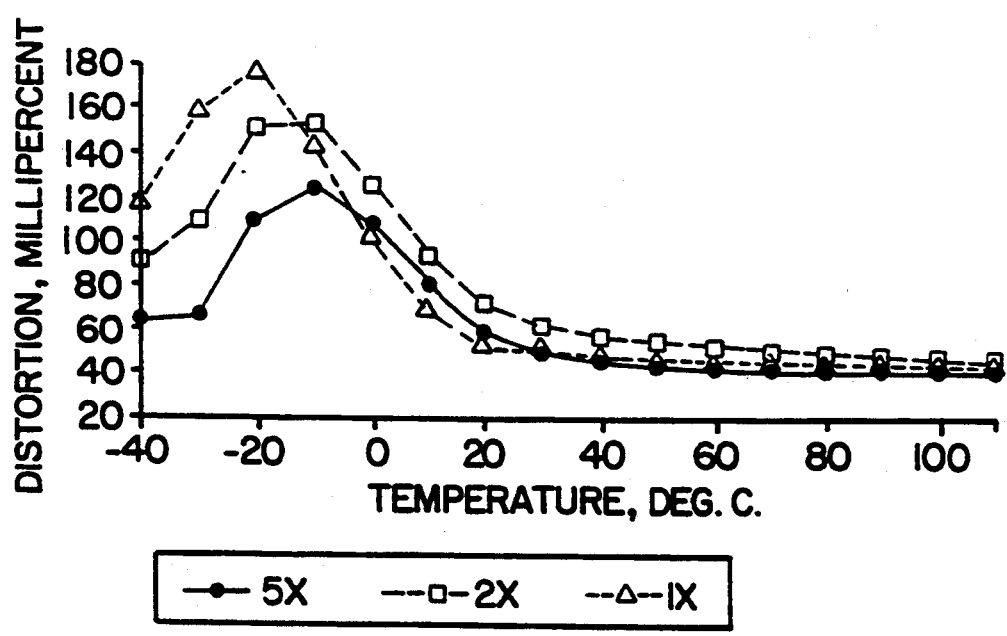
FIG. 14 shows the temperature dependence of Total Harmonic Distortion for 1×, 2× and 5× linear amplifiers.
Figure 15:
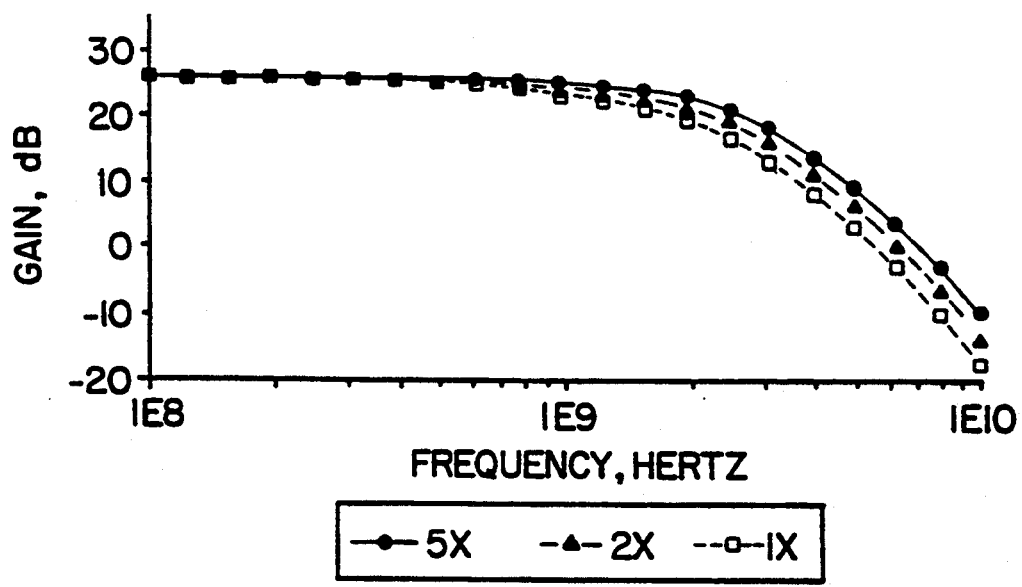
FIG. 15 shows the variation in frequency response with transistor sizes of 1×, 2× and 5×.
Figure 16:
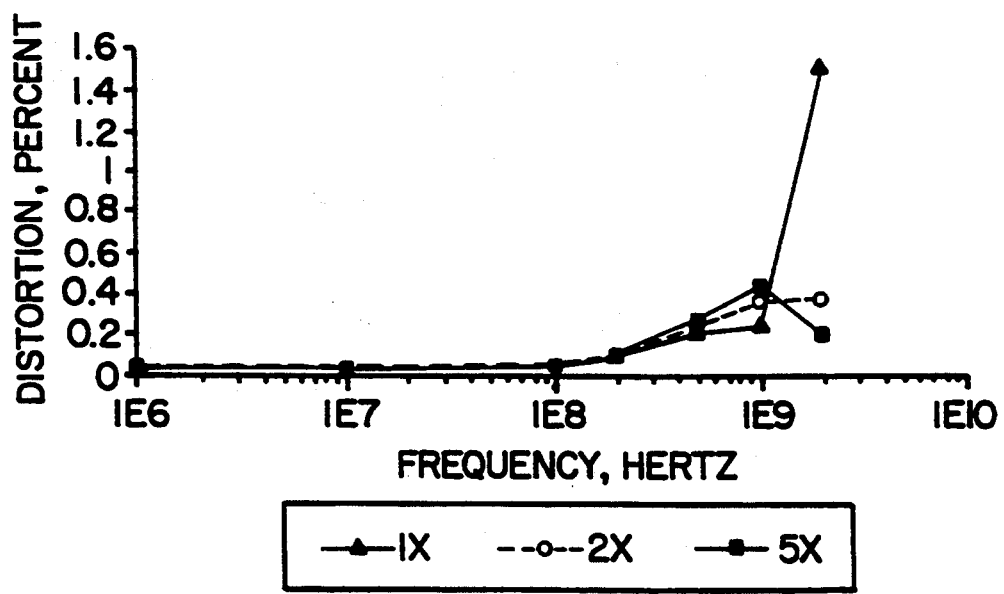
FIG. 16 shows the variation of distortion as a function of frequency for different transistor sizes.

Finally, additional SPICE analysis results are shown in FIG. 13 through FIG. 16. FIG. 13 illustrates the excellent group delay distortion, in which the linear amplifier shows a marginal improvement over the regular differential pair. FIG. 14 shows the small temperature dependence of THD which increases somewhat at low temperatures, though remaining substantially lower than for the standard differential pair. FIG. 15 shows the small variation of frequency response with transistor sizes of 1×, 2× and 5× transistors. Lastly the variation of THD with transistor size and frequency is illustrated in FIG. 16. Other parameters of interest are the Noise Figure and the Third Order Intercept. The Noise Figure was found to be about 1 dB worse than for the standard differential pair, but the Third Order Intercept was found to be 3 dB better, indicating an overall improvement in the dynamic range compared to the standard differential amplifier. These illustrations show that the linear amplifier described is robust and generally immune to normal processing and temperature variations.

As described, the basic amplifier may be incorporated in configurations designed for higher bandwidth, such as with a cascode amplifier in series with the output load. Similarly the linear amplifier may be used with advantage in the well known TASTIS amplifier arrangement where it is used as a transadmittance amplifier in cascode connection with a transimpedance amplifier. Also the amplifier may be used with advantage in a linear mixer, as the lower multiplying element. Further, it may be used with advantage in a microwave oscillator where the improved linearity enhances the noise performance. These and similar applications are within the scope of this invention.

We claim:

1. A linear amplifier comprising:
a first differential pair having first and second bipolar transistors;
a second differential pair having third and fourth bipolar transistors;
a third differential pair having fifth and sixth bipolar transistors;
first, second and third constant current sources, said first current source connected to commonly connected emitters of said first and second transistors, said second current source connected to commonly connected emitters of said third and fourth transistors, said third current source connected to commonly connected emitters of said fifth and sixth transistors, respective bases of said first, third and fifth transistors connected to a first input; respective bases of said second, fourth and sixth transistors connected to a second input, respective collectors of said first, third and fifth transistors connected to a first output, respective collectors of said second, fourth and sixth transistors connected to a second output, said first and second outputs being connected to a positive supply via first and second load resistors respectively, wherein the gain of said amplifier is linearized by an offset voltage generated by ratioed bipolar transistors, the ratio being an integer greater than four.

2. A linear amplifier as defined in claim 1, said ratioed transistors being in two of said first, second or third differential pairs.

3. A linear amplifier as defined in claim 1, said ratioed transistors being in said first and second differential pairs wherein the effective emitter area of said first transistor is larger than the effective emitter area of the second transistor by a factor N and the effective emitter area of the third transistor is smaller than the effective emitter area of the fourth transistor by a factor N, N being an integer.

4. A linear amplifier as defined in claim 3, wherein $N=9$.

5. A linear amplifier as defined in claim 1, said first and second outputs connected to first and second cascode output stages respectively.

6. A linear amplifier as defined in claim 1, said first, second and third current sources being matched.

7. A linear amplifier comprising:

a first differential pair having first and second bipolar transistors;

a second differential pair having third and fourth bipolar transistors;

a third differential pair having fifth and sixth bipolar transistors;

first, second and third constant current sources, said first current source connected to commonly connected emitters of said first and second transistors, said second current source connected to commonly connected emitters of said third and fourth transistors, said third current source connected to commonly connected emitters of said fifth and sixth transistors, respective bases of said first, third and fifth transistors selectively connected to a first input via a first emitter follower circuit; respective bases of said second, fourth and sixth transistors selectively connected to a second input via a second emitter follower circuit, respective collectors of said first, third and fifth transistors connected to a first output, respective collectors of said second, fourth and sixth transistors connected to a second output, said first and second outputs being connected to a positive supply via first and second load resistors respectively, wherein the gain of said amplifier is linearized by an offset voltage generated by ratioed bipolar transistors, the ratio being an integer.

8. A linear amplifier as defined in claim 7, said ratioed transistors being in said first and second emitter follower circuits.

9. A linear amplifier as defined in claim 8, said first emitter follower circuit comprising seventh and eighth input bipolar transistors and current sources comprising ninth and tenth bipolar transistors, the bases of the seventh and eighth transistors being commonly connected to an input terminal, respective collectors connected to the positive supply, the emitter of the seventh transistor connected to the base of the first transistor and the collector of the ninth transistor, the emitter of the eighth transistor connected to the bases of the third and fifth transistors, and the collector of the tenth transistor, the effective emitter area of the seventh transistor being smaller than the effective emitter area of the ninth transistor by a factor N and the effective emitter area of the eighth transistor being larger than the effective emitter area of the tenth transistor by a factor N, and said second emitter follower circuit comprises an eleventh and a twelfth input bipolar transistor and associated current sources comprising thirteenth and fourteenth bipolar transistors, the bases of said eleventh and twelfth transistors being commonly connected to an input terminal, respective collectors commonly connected to the positive supply, the emitter of the eleventh transistor connected to the base of the fourth transistor and the collector of the thirteenth transistor, the emitter of the twelfth transistor connected to the bases of the second and sixth transistors and the collector of the fourteenth transistor, the effective emitter area of the eleventh transistor being smaller than the effective emitter area of the thirteenth transistor by a factor N, and the effective emitter area of the twelfth transistor being larger than the effective emitter area of the fourteenth transistor by a factor N wherein N is an integer.

10. A linear amplifier as defined in claim 9 wherein $N=3$.

* * * * *